US011296224B1

(12) United States Patent
Thakuria et al.

(10) Patent No.: US 11,296,224 B1
(45) Date of Patent: Apr. 5, 2022

(54) NON-VOLATILE POLARIZATION INDUCED STRAIN COUPLED 2D FET MEMORY

(71) Applicant: Purdue Research Foundation, West Lafayette, IN (US)

(72) Inventors: Niharika Thakuria, West Lafayette, IN (US); Sumeet Kumar Gupta, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 17/349,898

(22) Filed: Jun. 16, 2021

(51) Int. Cl.
| | |
|---|---|
| *G11C 11/22* | (2006.01) |
| *H01L 29/78* | (2006.01) |
| *H01L 29/76* | (2006.01) |
| *H01L 27/1159* | (2017.01) |
| *H01L 29/24* | (2006.01) |
| *H01L 29/51* | (2006.01) |

(52) U.S. Cl.
CPC ...... *H01L 29/78391* (2014.09); *G11C 11/223* (2013.01); *G11C 11/2273* (2013.01); *G11C 11/2275* (2013.01); *H01L 27/1159* (2013.01); *H01L 29/24* (2013.01); *H01L 29/516* (2013.01); *H01L 29/7606* (2013.01)

(58) Field of Classification Search
CPC .......... H01L 29/78391; H01L 27/1159; H01L 29/24; H01L 29/516; H01L 29/7606; G11C 11/223; G11C 11/2273; G11C 11/2275
USPC ....................................................... 365/145
See application file for complete search history.

(56) References Cited

U.S. PATENT DOCUMENTS

| | | | |
|---|---|---|---|
| 6,034,884 A | 3/2000 | Jung | |
| 7,432,542 B2 * | 10/2008 | Ishimaru | ......... H01L 21/823807 257/289 |
| 9,190,135 B2 * | 11/2015 | Appenzeller | ....... H01L 27/1159 |
| 9,263,582 B2 * | 2/2016 | Kronholz | ............ H01L 29/7849 |
| 9,685,500 B2 * | 6/2017 | Yamazaki | ........... H01L 27/1156 |
| 9,853,150 B1 * | 12/2017 | Colinge | ............ H01L 29/40111 |
| 10,964,824 B2 | 3/2021 | Das | |

(Continued)

FOREIGN PATENT DOCUMENTS

| | | | |
|---|---|---|---|
| CN | 111739935 A | * 10/2020 | |
| KR | 20150128609 A | * 11/2015 | ......... H01L 27/3244 |

OTHER PUBLICATIONS

Raymond Hueting, "The Balancing Act in Ferroelectric Transistor: How hard can it be?", Nov. 2018, Institute of Technology, University of Twente, (Year: 2018).*

(Continued)

*Primary Examiner* — Viet Q Nguyen
(74) *Attorney, Agent, or Firm* — Piroozi-IP, LLC

(57) ABSTRACT

A polarization induced strain coupled two dimensional field effect transistor (PoSt FET) memory cell is disclosed which includes a transistor including a source contact, a drain contact, a gate contact, a back contact, a channel disposed atop the gate contact, wherein the channel and the gate are separated by an electrically insulating material, and a piezoelectric (PE)/ferroelectric(FE) (PE/FE) layer disposed between the gate contact and the back contact and configured to store bit information in form of ferroelectric polarization (P), wherein a ratio of cross-sectional area of the channel to cross-sectional area of the PE/FE layer is between about 0.03 to about 0.07.

22 Claims, 12 Drawing Sheets

(56) References Cited

U.S. PATENT DOCUMENTS

| | | | |
|---|---|---|---|
| 2009/0040808 A1* | 2/2009 | Krieger | H01L 29/40111 365/145 |
| 2018/0337238 A1* | 11/2018 | Eom | H01L 29/24 |
| 2018/0374962 A1* | 12/2018 | Das | H01L 29/516 |
| 2019/0363247 A1 | 11/2019 | Zemen et al. | |
| 2020/0279598 A1 | 9/2020 | Jiang et al. | |
| 2020/0303417 A1* | 9/2020 | Teo | G11C 14/0045 |

OTHER PUBLICATIONS

Winterfield et al, "A stress sensor base don a silicon FET comprising a Piezeoelectric AlN gate dielectric", May 2019, Journal or Materials Science: Material sin Electronics, vol. 30, pp. 11493-11498 (Year: 2019).*

Fei Xue et al, "Emerging Van De Waals Ferroelectrics: Unique properties and novel devices", 2021, Applied Physics Reviews, vol. 8, 021316. (Year: 2021).*

Chen, A review of emerging non-volatile memory (NVM) technologies and applications, Solid-State Electronics 125, pp. 25-38, 2016.

Bibes, Nanoferronics is a winning combination, Nature Mater 11, pp. 354-357, 2012.

Apalkov et al., Spin-transfer torque magnetic random access memory (STT-MRAM), ACM J. Emerg. Technol. Comput. Syst., vol. 9, No. 2, pp. 1-35, May 2013.

Chen et al., Resistive random access memory (RRAM) technology: From material, device, selector, 3D integration to bottom-up fabrication, J. Electroceramics, vol. 39, No. 1-4, pp. 21-38, Dec. 2017.

Lee et al., Phase-Change Technology and the Future of Main Memory, IEEE Micro, vol. 30, No. 1, pp. 131-141, Jan. 2010.

Gupta et al., Harnessing ferroelectrics for non-volatile memories and logic, 2017 18th International Symposium on Quality Electronic Design (ISQED), Santa Clara, CA, pp. 29-34, 2017.

Ma et al., Why is nonvolatile ferroelectric memory field-effect transistor still elusive?, IEEE Electron Device Letters, vol. 23, No. 7, pp. 386-388, Jul. 2002.

Thirumala et al., Gate leakage in non-volatile ferroelectric transistors: Device-circuit implications, Device Research Conference—Conference Digest, DRC, vol. 2018—Jun. 2018.

Newns et al., High Response Piezoelectric and Piezoresistive Materials for Fast, Low Voltage Switching: Simulation and Theory of Transduction Physics at the Nanometer-Scale. Adv. Mater., 24: 3672-3677, 2012.

Schulman, Contact, Interface, and Strain Engineering of Two-Dimensional Transition Metal Dichalcogenide Field Effect Transistors Order No. 28123316, The Pennsylvania State University, Ann Arbor, 2019.

Thakuria et al., Polarization-induced Strain-coupled TMD FETs (PS FETs) for Non-Volatile Memory Applications, 2020 Device Research Conference (DRC), pp. 1-2, 2020.

Peña-Álvarez et al., Single Layer Molybdenum Disulfide under Direct Out-of-Plane Compression: Low-Stress Band-Gap Engineering, Nano Lett., vol. 15, No. 5, pp. 3139-3146, May 2015.

Malakooti et al., Noncontact and simultaneous measurement of the d33 and d31 piezoelectric strain coefficients, Appl. Phys. Lett. 102, 061901, 2013.

Dybała et al., Pressure coefficients for direct optical transitions in $MoS_2$, $MoSe_2$, $WS_2$, and $WSe_2$ crystals and semiconductor to metal transitions. Sci Rep 6, 26663, 2016.

Nayak et al., Pressure-induced semiconducting to metallic transition in multilayered molybdenum disulphide, Nat. Commun., vol. 5, No. 1, 3731, 2014.

English et al., Improved Contacts to $MoS_2$ Transistors by Ultra-High Vacuum Metal Deposition, Nano Lett. 2016, 16, 6, pp. 3824-3830, May 2016.

Yu et al., Analyzing the Carrier Mobility in Transition-Metal Dichalcogenide $MoS_2$ Field-Effect Transistors, Adv. Funct. Mater. 2017.

Aziz et al., Physics-Based Circuit-Compatible SPICE Model for Ferroelectric Transistors, IEEE Electron Device Letters, vol. 37, No. 6, pp. 805-808, Jun. 2016.

Suryavanshi et al., S2DS: Physics-based compact model for circuit simulation of two-dimensional semiconductor devices including nonidealities, Journal of Applied Physics 120, 224503, 2016.

* cited by examiner

NON-VOLATILE POLARIZATION INDUCED STRAIN COUPLED 2D FET MEMORY

CROSS-REFERENCE TO RELATED APPLICATIONS

None.

STATEMENT REGARDING GOVERNMENT FUNDING

None.

TECHNICAL FIELD

The present disclosure generally relates to a non-volatile memory, and in particular, to a non-volatile memory based on polarization induced strain in a ferroelectric material.

BACKGROUND

This section introduces aspects that may help facilitate a better understanding of the disclosure. Accordingly, these statements are to be read in this light and are not to be understood as admissions about what is or is not prior art.

A non-volatile memory (NVM) is a type of memory that maintains its value when power has been removed. In the post-Moore law era, many investigators have been working on alternative approaches to NVM. Chief amongst these alternatives are Heat Assisted Magnetic Recording (HAMR), spin-transfer torque RAM (STT-RAM), Phase-change memory (PCM), Resistive RAM (RRAM), ferroelectric RAM (FERAM or FRAM), and ferroelectric transistor (FEFET) memory. Each of these have approaches have advantages and disadvantages. For example, HAMR suffers from low performance. FERAM and FEFET based memories show distinct advantages due to electric field (E) driven low-power writes. However, there are issues in ferroelectric (FE) based NVM such as destructive read in FERAMs. FEFET based NVMs without inter-layer metal show concerns such as traps and depolarization fields and FEFETs with floating inter-layer metal exhibit gate leakage.

Several investigators have addressed the issue of destructive read in FRAMs. For example, U.S. Pub. 2019-0363247 for Zemen et al. describes an NVM with a strain inducing layer which induces a strain in a ferromagnetic layer which can maintain a magnetization direction and read as a value held by the cell.

However, additional improvements are needed to improve readability of the cell without flipping the cell value during the read operations.

Therefore, there is an unmet need for a novel approach in ferroelectric-based memory that addresses destructive reads as well as provide a high level of fidelity when reading the cell value.

SUMMARY

A polarization induced strain coupled two dimensional field effect transistor (PoSt FET) memory cell is disclosed. The PoSt FET memory cell includes a transistor. The transistor includes a source contact, a drain contact, a gate contact, a back contact, a channel disposed atop the gate contact. The channel and the gate are separated by an electrically insulating material. The PoSt FET memory cell also includes a piezoelectric (PE)/ferroelectric(FE) (PE/FE) layer disposed between the gate contact and the back contact and configured to store bit information in form of ferroelectric polarization (P). A ratio of cross-sectional area of the channel to cross-sectional area of the PE/FE layer is between about 0.03 to about 0.07.

A method of maintain a digital bit value in a polarization induced strain coupled two dimensional field effect transistor (PoSt FET) memory cell is also disclosed. The method includes providing a transistor configured to maintain a bit value. The transistor includes a source contact, a drain contact, a gate contact, and a back contact. The transistor also includes a channel disposed atop the gate contact, wherein the channel and the gate are separated by an electrically insulating material. Furthermore, the transistor includes a piezoelectric (PE)/ferroelectric(FE) (PE/FE) layer disposed between the gate contact and the back contact and configured to store bit information in form of ferroelectric polarization (P), wherein a ratio of cross-sectional area of the channel to cross-sectional area of the PE/FE layer is between about 0.03 to about 0.07, and wherein the bit value is maintained based on polarization of the PE/FE layer, whereby the polarization induced strain in the PE/FE layer is transferred to the channel.

A memory array is also disclosed. The memory array includes a plurality of polarization induced strain coupled two dimensional field effect transistor (PoSt FET) memory cells, disposed in one or more rows and one or more columns. Each PoSt FET memory cell includes a transistor. The transistor includes a source contact, a drain contact, a gate contact, a back contact, a channel disposed atop the gate contact. The channel and the gate are separated by an electrically insulating material. The PoSt FET memory cell also includes a piezoelectric (PE)/ferroelectric(FE) (PE/FE) layer disposed between the gate contact and the back contact and configured to store bit information in form of ferroelectric polarization (P). A ratio of cross-sectional area of the channel to cross-sectional area of the PE/FE layer is between about 0.03 to about 0.07. The gate contact of each of the PoSt FET memory cells in each row of the one or more rows is coupled to an associated word line (WL) for said row. The back contact of each of the PoSt FET memory cells in each column of the one or more columns is coupled to an associated write bit line (WBL) for said column. The drain contact of each of the PoSt FET memory cells in each column of the one or more columns is coupled to an associated read bit line (RBL) for said column. A PoSt FET memory cell in a row and a column is written to by activating an associated WBL and WL and a PoSt FET memory cell in a row and a column is read from by activating an associated RBL and WL.

DETAILED DESCRIPTION

Figure 1A:
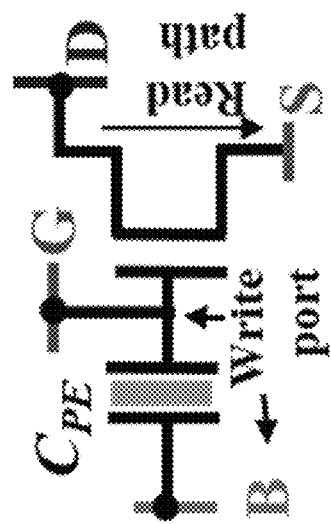
FIG. 1a is a cross-section of a polarization induced Strain coupled 2D FET (PoSt FET) memory cell, according to the present disclosure as well as a symbolic representation of PoSt FET memory cell.
Figure 1A:
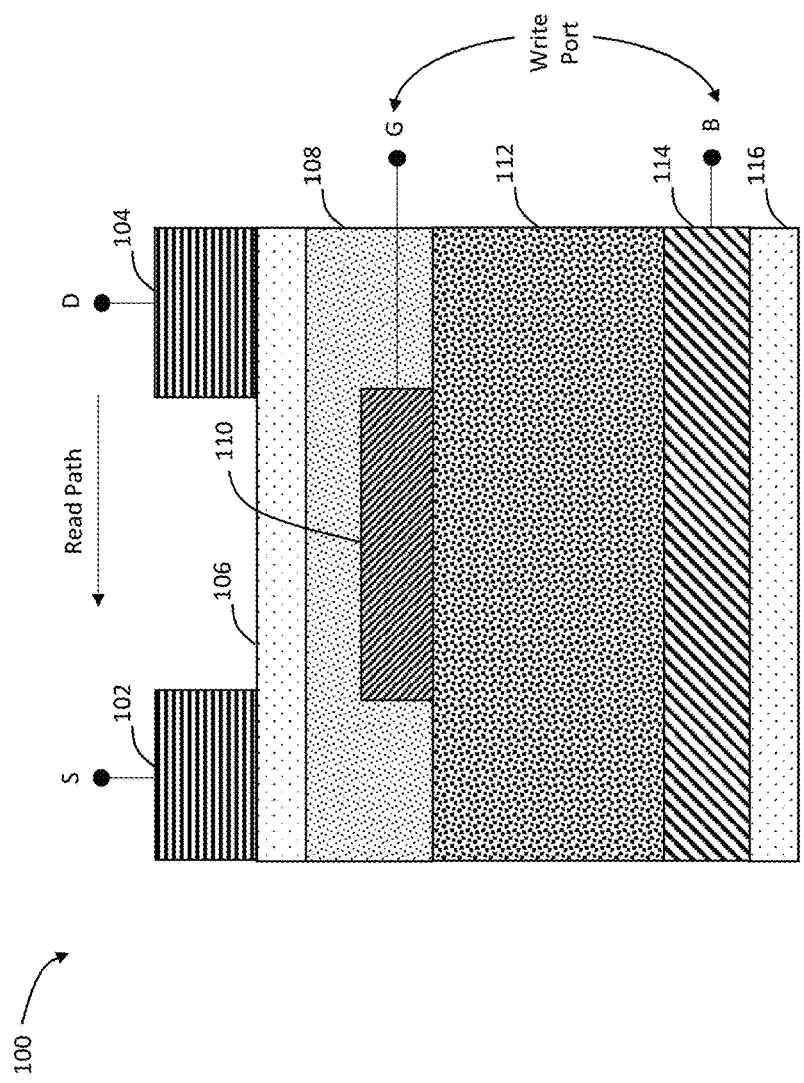
Figure 1B:
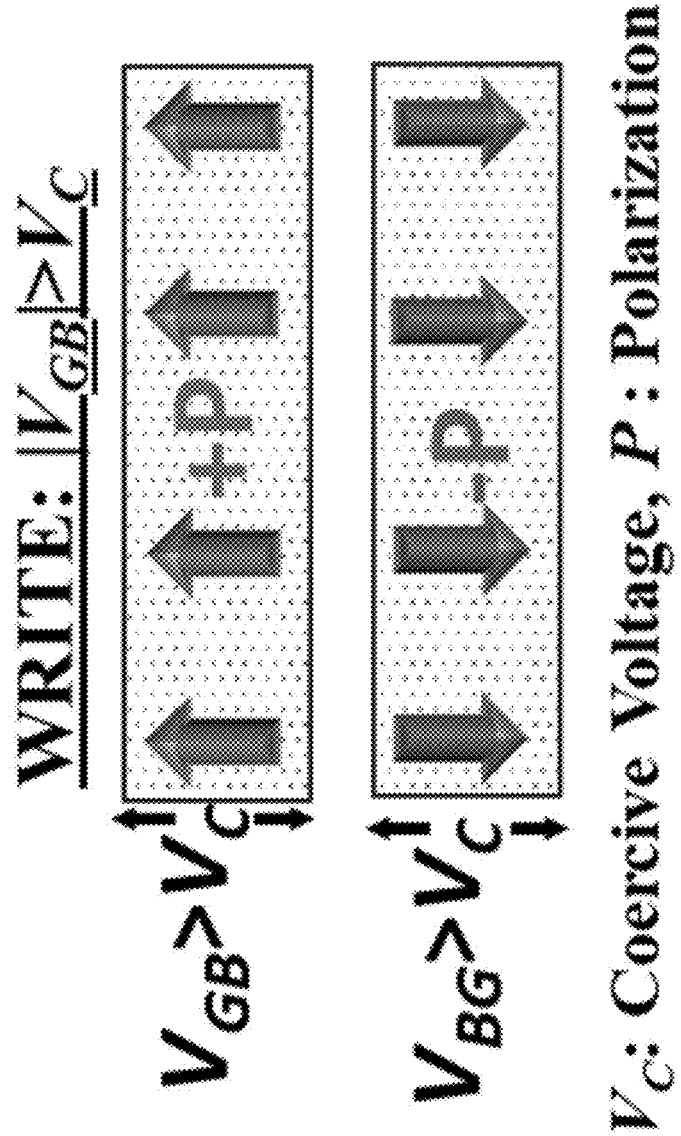
FIG. 1b is a schematic representation of a write operation.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

A novel approach in ferroelectric-based memory is presented in the present disclosure that addresses the aforementioned issues of the prior art cells such as destructive reads as well as provide a high level of fidelity when reading the cell value. Towards this end, a novel low power non-volatile memory utilizing FE polarization-based bit storage/switching and piezoelectricity induced dynamic bandgap modulation for bit sensing is presented. While retaining the low power electric-field driven write attributes of FE based non-volatile memory, the presented memory provides low power non-destructive read solution. A polarization induced Strain coupled 2D FET (PoSt FET) memory cell 100 is provided in the present disclosure, as presented in FIG. 1a which is a cross-sectional view of the cell. Referring to FIG. 1a, the PoSt FET memory cell 100 provides the following features: (a) FE polarization-based bit-storage, (b) E driven write, and (c) coupling of piezoelectricity of FE with dynamic bandgap (EG) tuning of Transition Metal Dichalcogenides (TMDs) for read. The PoSt FET cell 100 is a 4-terminal device including metal contacts for source 102 (S), drain 104 (D), gate 110 (G), and back 114 (B). The PoSt FET memory cell 100 further includes a channel 106 disposed atop the gate 110. The channel 106 of the PoSt FET memory cell 100 is based on a two-dimensional Transition Metal Dichalcogenides (2D TMD) (selected from the group consisting of $MoS_2$, $MoSe_2$, $WS_2$, $WSe_2$) controlled by gate 110 which is disposed on a dielectric 108. A piezoelectric (PE)/ferroelectric (FE) material 112 (such as PZT, silicon doped $HfO_2$ and combinations thereof $HfO_2$) disposed between the gate 110 the back 114 stores the bit information in the form of ferroelectric polarization (P), with +(−) P representing logic '1' ('0'). Combinations thereof TMD and PE from the above groups may be used in the device. To write (i.e., to switch P), a voltage across PE ($V_{GB}$) is applied such that the electric field (|E|) is greater than the coercive field ($E_C$), where $V_C$ (i.e., the voltage across the PE/FE material 112) is $E_C$ times the thickness of the PE/FE (or simply PE or simply FE) material 112. The polarity of $V_{GB}$ determines the logic (P+ or P−) state written in the device. Referring to 1b, a schematic of write operation is shown by way of a change in polarization in the PE/FE material 112. When the voltage across the gate and back (i.e., the voltage across the PE/FE material which is $V_{GB}$) is greater than $V_C$, the polarization of the PE/FE material is positive; however, when the voltage across the gate and back (i.e., $V_{GB}$) is less than $-V_C$, the polarization of the PE/FE material is negative.

Figure 1C:
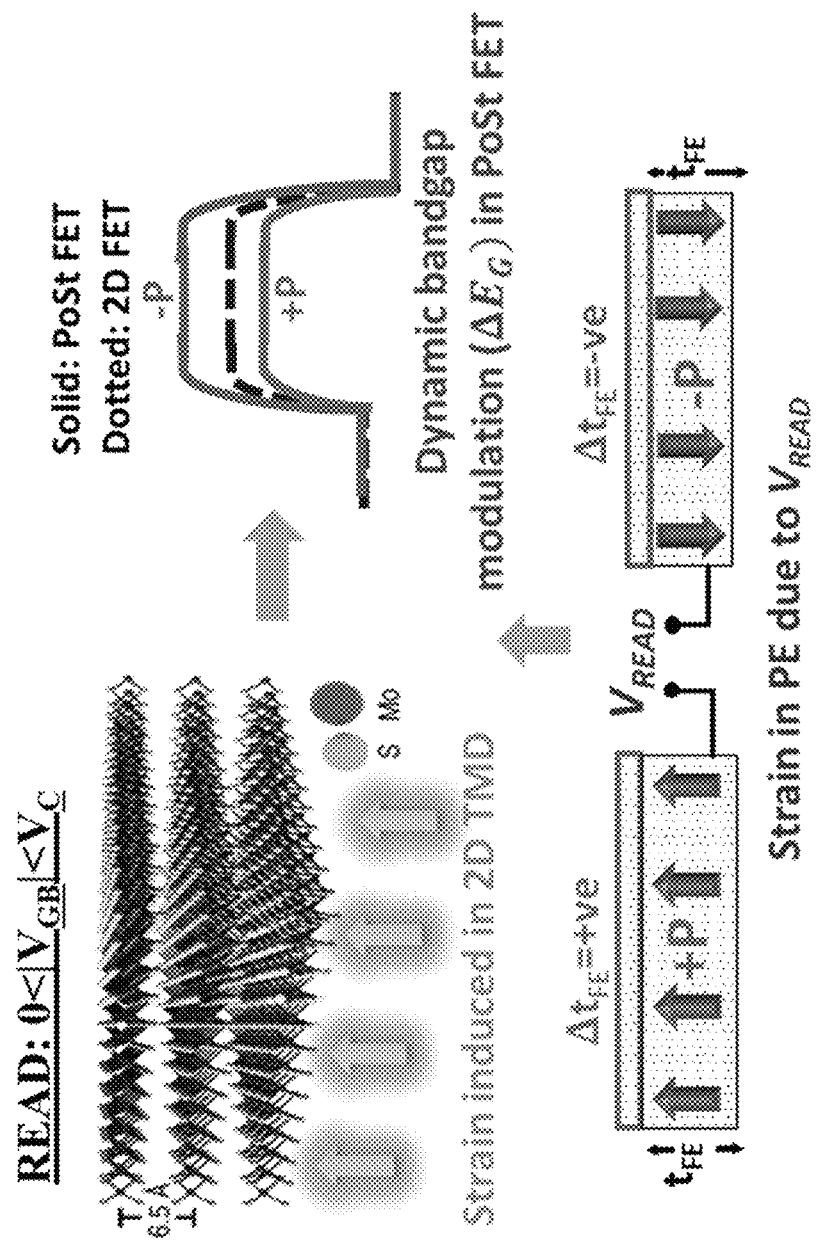
FIG. 1c is a schematic representation of a read operation.
Figure 1D:
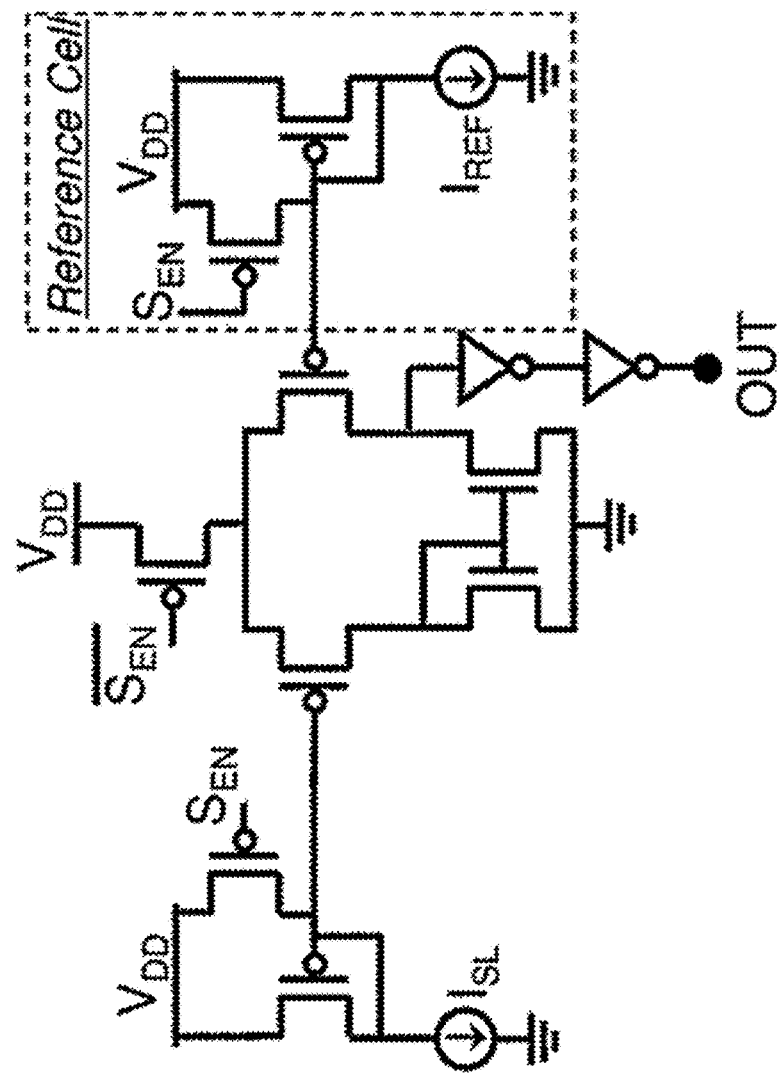
FIG. 1d is a schematic representation of the PoSt FET memory cell of FIG. 1a coupled to a sense amplifier.

Alternatively, referring to FIG. 1c, a schematic of read operation is shown by way of sensing drain to source current, $I_{DS}$. For the read operation two conditions must occur: 1) a gate to back voltage (i.e., $V_{GB}$) must be applied which is less than $V_C$, thereby avoiding flipping the stored value; and 2) a $V_{GS}$ voltage must be applied that is higher than the transistor's threshold voltage in order to turn on the transistor to thereby establish $I_{DS}$ which can be measured and compared to a threshold to determine the stored bit value as described below. To read the stored bit value, strain induced in the PE/FE material 112 is ascertained and related to the bit value stored (i.e., written) in the PE/FE material 112. The induced strain in the PE/FE material 112 is transferred to the 2D TMD material of the channel 106. To sense the stored bit, polarization-induced strain (S) in PE/FE material 112 is used which transduces as out-of-plane stress in the 2D TMD material of the channel 106, leading to dynamic modulation in the bandgap ($\Delta E_G$). This, in turn, tunes the drain current ($I_{DS}$) leading to low/high resistance states (LRS/HRS) of PoSt FET memory cell 100. For P+, S>0 and $\Delta E_G$<0 which yields high $I_{DS}$=$I_{LRS}$. Similarly, P− yields S<0, $\Delta E_G$>0 and low $I_{DS}$=$I_{HRS}$. To efficiently transduce strain from PE to TMD, we utilize the hammer and nail effect, wherein the area of TMD above the gate ($A_{TMD}$) acts as the nail while PE serves as the hammer. For that, $A_{TMD}$ is designed to be smaller than the cross-sectional area of PE ($A_{PE}$).

Figure 2A:
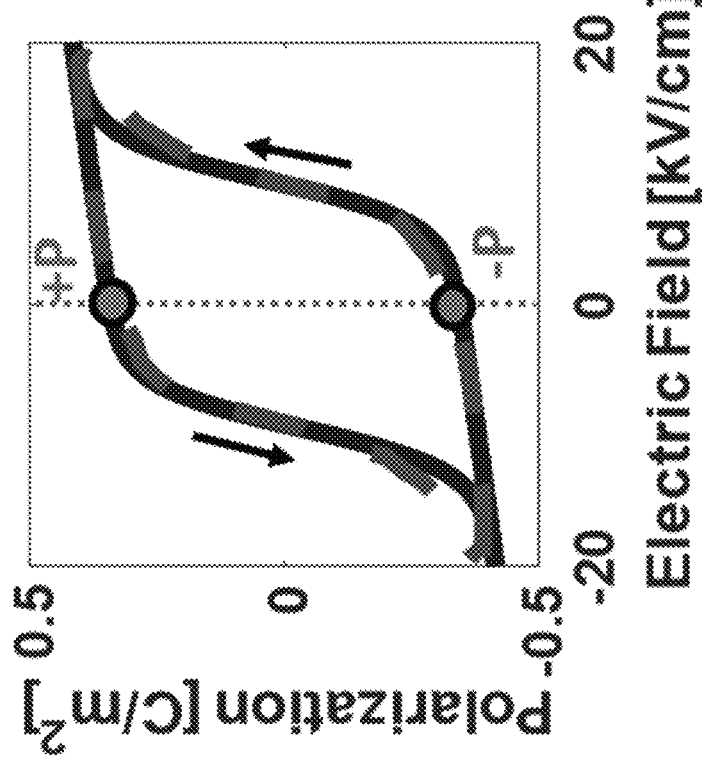
FIG. 2a is a graph of polarization in $C/m^2$ vs. electric field in kV/cm which shows a hysteresis curve for switching polarization from P+ to P−.

Referring to FIG. 2a, a graph of polarization in $C/m^2$ vs. electric field in kV/cm is provided which shows a hysteresis curve for switching polarization from P+ to P−. A width of the hysteresis curve across polarization at about 0, quantified by the coercive field/voltage ($E_C/V_C$), is desirable so that there can be sufficient margins for non-destructive reads. Piezoelectric material PZT-5H with $E_C$ of about 9.5 kV/cm satisfies this condition. Moreover, the magnitude of polarization determines the strain in PE required for distinguishing bit value during a read. FIG. 2a of PZT-5H is based on remanent polarization ($P_R$) of about 0.30 $C/m^2$, and $E_C$ of about 9.5 kV/cm. Higher polarization provides larger strain.

Figure 2B:
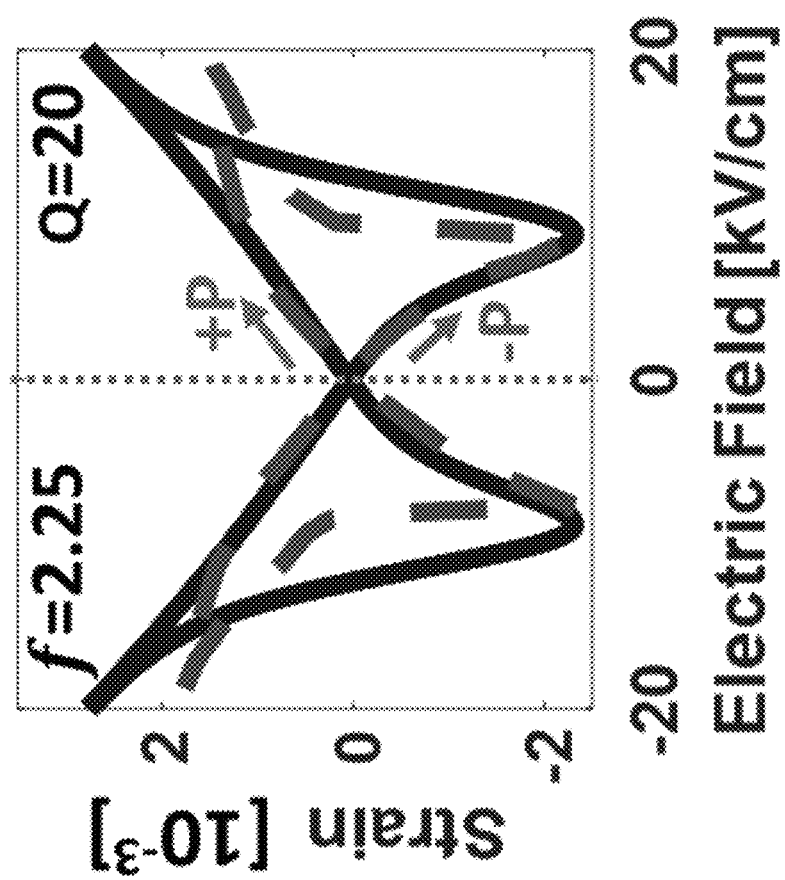
FIG. 2b is a graph of strain (scaled as $10^{-3}$) vs. Electric field in kV/cm.

Referring to FIG. 2b, a graph of strain (scaled as $10^{-3}$) vs. Electric field in kV/cm is also shown. The slope of this plot at about strain=0 (quantified by the parameter piezoelectric coefficient, $d_{33}$) determines the distinguishability of P+ and P− states during read. Higher the slope, better distinguishability of P+ and P− is achieved. FIG. 2b of PZT-5H shows a $d_{33}$ of about 650 picometers(pm)/V. Piezoelectric materials with large piezoelectric effect ($d_{33}$) are desirable. Simultaneously, it should also show good ferroelectric properties, viz., high remnant polarization ($P_R$) and high coercive field ($E_C$). Both of these requirements are fulfilled by PZT-5H. Although PMN-PT has impressive piezoelectric effect ($d_{33}$=850 pm/V), it is not a suitable material for PoSt FET due to its low coercive field ($E_C$=4 KV/cm).

The mathematical relationship associated with the dynamic modulation in the bandgap ($\Delta E_G$) is provided below which is also used in modeling the induced PE polarization. To analyze the described PoSt FET, we developed a simulation framework shown in FIG. 3a. We model the P-E response of PZT-5H using Landau-Khalatnikov (LK) equation and calibrate it with experiment as shown in FIG. 2a. We utilize the S-E response from the same experiments to extract piezoelectric coefficients ($d_{33}$ and $d_{31}$) of PZT-5H. These parameters are used to model pressure transduced to TMD ($\sigma_{TMD}$) using COMSOL MULTIPHYSICS SUITE. We simulate the full 3D structure of the presented PoSt FET (including the hammer and nail effect) in COMSOL and employ the strain-charge form of the constitutive equations for PE with proper hard boundary conditions to obtain $\sigma_{PE}$ and $\sigma_{TMD}$. $\sigma_{TMD}$ is converted to $\Delta E_G$ and self-consistently coupled with the TMD charge/potential model.

$$E = \alpha P + \beta P^2 + \gamma P^5 + \rho \frac{dP}{dt} \quad (1)$$

where $\alpha, \beta, \gamma$ are static coefficients of ferroelectric;
$\rho$ is the kinetic coefficient.
Equation 1 is the Landau Khalatnikov (LK) equation used for modeling polarization.

$$\Delta E_G = \alpha_{TMD} \sigma_{TMD} \quad (2)$$

where $\alpha_{TMD}$ is pressure coefficient, and
$\delta_{TMD}$ is stress in 2D TMD channel modeled in COMSOL Multiphysics Suite $$I_{DS} = f(E_0 + \Delta E_G, V_{GS}, V_{DS}) \quad (3)$$

Where $E_0$ is the intrinsic bandgap which is 1.5 eV,
$\Delta E_G$ is bandgap modulation,
$V_{GS}$ is gate to source voltage, and
$V_{DS}$ is drain to source voltage.

Figure 3A:
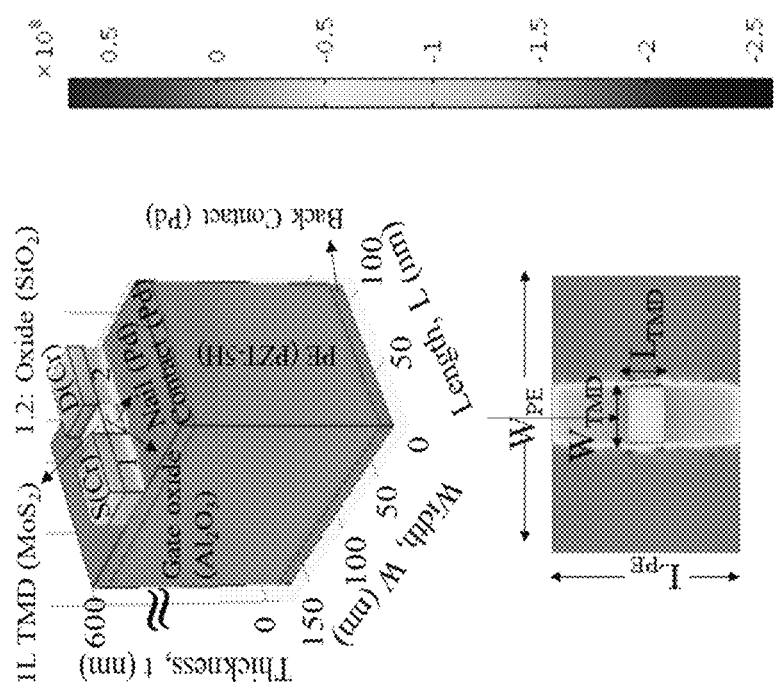
FIG. 3a is a simulation platform used to analyze the PoSt FET memory cell of FIG. 1.
Figure 3B:
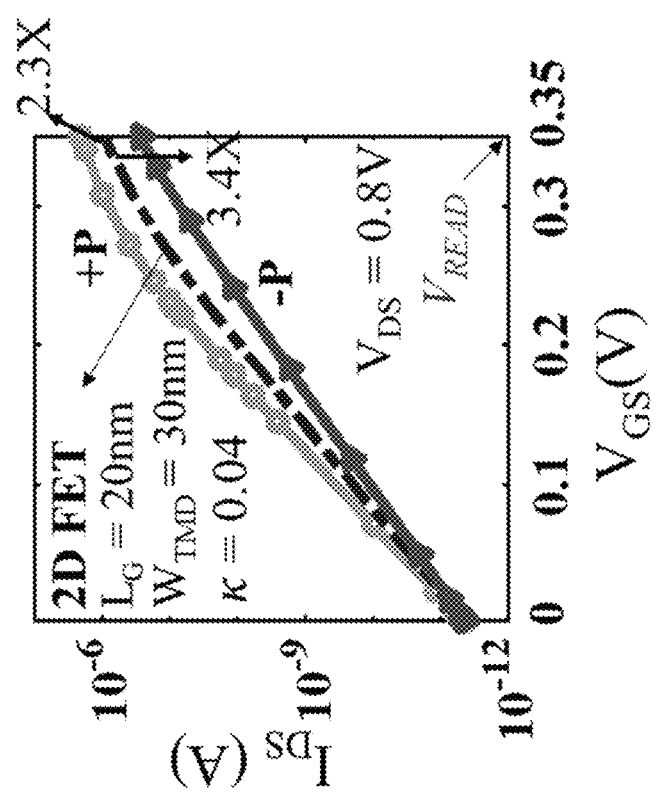
FIG. 3b is a graph of $I_{DS}$ vs. $V_{GS}$ for a κ of 0.04.

A comparison between a typical 2D FET and the PoSt FET of the present disclosure shows a higher current for $I_{LRS}$ and a lower current for $I_{HRS}$ as shown in FIG. 3b which includes a graph of $I_{DS}$ vs. $V_{GS}$ and a zoomed-in version of the graph for a κ of 0.04. It should be noted that κ depends on device geometry. In particular, κ is the ratio of the cross-sectional area of the ferroelectric-piezoelectric material to the 2D TMD material (i.e., $L_{2D}W_{2D}/L_{PE}W_{PE}$, where 2D refers to the 2D TMD material). Results show a range of acceptable κ. The minimum acceptable κ is between about 0.03 to about 0.07 and that is based on distinguishability and sense margin (>1 uA) shown in Table 1. At the minimum allowable area of PE which is 9*3λ² (κ=0.22) a distinguishability of 1.6 and sense margin <1 uA, are achieved which are undesirable.

TABLE 1

PoSt dimensional characteristics

| TMD Width (F*/2) | TMD Length (F*/2) | PE Width (F*/2) | PE Length (F*/2) | κ | Distinguishability | Sense Margin (A) |
|---|---|---|---|---|---|---|
| 3 | 2 | 18 | 9 | 0.037037 | 1.06E+01 | 1.2745E-06 |
| 3 | 2 | 15 | 9 | 0.044444 | 8.18E+00 | 1.20347E-06 |
| 3 | 2 | 12 | 9 | 0.055556 | 5.87E+00 | 1.12453E-06 |
| 3 | 2 | 9 | 9 | 0.074074 | 3.98E+00 | 1.04555E-06 |
| 3 | 2 | 3 | 9 | 0.222222 | 1.608391608 | 9.325E-07 |

*F is the feature size which is a technology-dependent value

In order to model PoSt FET, P is coupled with S equations of PE/FE with strain induced dynamic bandgap modulation ($\Delta E_G$) of TMD as provided in equations 1-3. The P-E and S-E plots are then calibrated which are obtained from the model as provided in FIGS. 2a and 2b with experiments performed for PZT. S induced $\Delta E_G$ as provided in equations 1-4 depends on parameters of the PE and 2D materials viz. [a] 2D out-of-plane compliance parameter ($C_{33}$); [b] coefficient of bandgap change in 2D (a); and [c] piezo compliance ($S_{33}$). $\Delta E_G$ also depends on stress reduction factor (κ) which is extracted based on aspect ratio of 2D and PE. Examples of these parameters are provided in Table 2 for demonstration purposes only, thus no limitation is intended hereby.

TABLE 2

Examples of parameters

| 2D Channel: MoS$_2$ | |
|---|---|
| $\alpha_{TMD}$ | 0.08 eV/GPa |
| $C_{33}$ | 60 GPa |
| $E_G$ | 1.5 eV |
| $t_{2D}$ | 2 nm |
| FE: PZT | |
| $S_{33}^E$ | 0.02 GPa$^{-1}$ |
| $t_{FE}$ | 600 nm |
| Device Geometry | |
| κ | 0.044 (see Table 1) |

The results from COMSOL simulations (shown in FIG. 3a) show that the hammer and nail effect cause $\sigma_{TMD}$ to be boosted compared to $\sigma_{PE}$ as shown in FIG. 3a, when the area of nail/TMD ($A_{TMD}$) is lower than that of PE ($A_{PE}$), the hammer. The device parameter $\kappa = A_{TMD}/A_{PE}$ is a measure of this effect, where smaller κ is expected to provide larger $\sigma_{TMD}$. We observe about 12× increase in $\sigma_{TMD}$ compared to $\sigma_{PE}$ at κ=0.04 (see Table 1). Optimization of the width of PE ($W_{PE}$) can enable tuning of κ (see FIG. 3a), and hence $\sigma_{TMD}$ and $\Delta E_G$. By increasing $W_{PE}$ from 90 nm to 180 nm, κ decreases from 0.07 to 0.03, leading to 1.78× increase in $\sigma_{TMD}$ and $\Delta E_G$.

To understand the unique read mechanism, the transfer ($I_{DS}-V_{GS}$) and output ($I_{DS}-V_{DS}$) characteristics PoSt FET are presented. It should be noted that a gate voltage ($V_G$) lower than coercive voltage ($V_C$=0.6V) of PZT is applied to ensure that the stored P state is undisturbed in this analysis. We apply gate voltage ($V_G$) which is lower than coercive voltage ($V_C$=0.6V) of PZT-5H to ensure that the stored P state is undisturbed in this analysis. For P+, PS FET shows 2.3× higher $I_{DS}$ ($I_{LRS}$) than standard 2D TMD FET while for P−, $I_{DS}$ is 3.4× lower ($I_{HRS}$) due to strain driven ∓$E_G$. Based on the $I_{DS}-V_{GS}$ characteristics, we identify that 0.3V<$V_{GS}$<0.4V provides optimal $I_{LRS}/I_{HRS}$, sufficient current necessary for read operation and ample read disturb margin ($V_C-V_{GS}$~200 mV). We choose $V_{GS}=V_{READ}$=0.35V that gives $I_{LRS}/I_{HRS}$ of about 8×. Note that $I_{LRS}/I_{HRS}$ can be improved by material optimizations and device optimization (e.g. by reducing κ).

Figure 4:
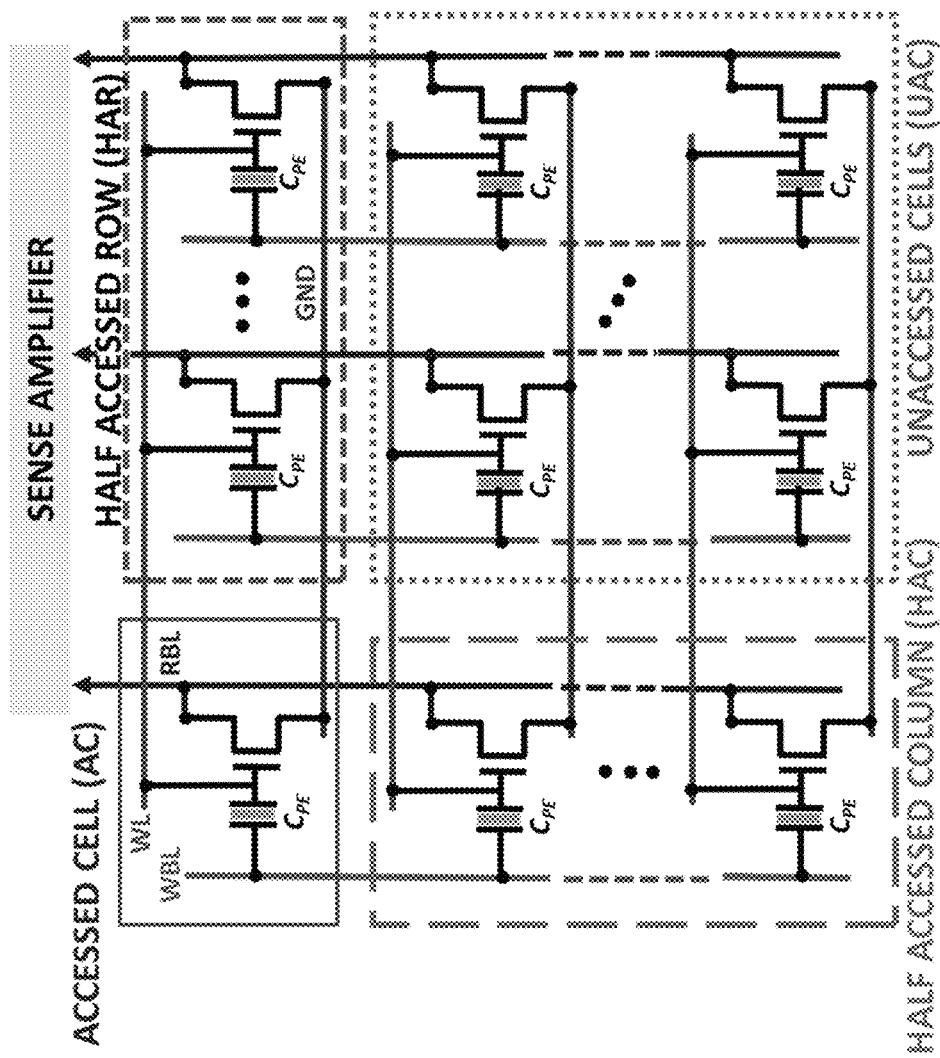
FIG. 4 is a PoSt FET Memory-based array.

Utilizing the PoSt FET memory cell presented above, a PoSt FET Memory-based array is presented in FIG. 4. Based on the unique read mechanism of PoSt FET, a decoupled read-write access-transistor-less memory array is also presented herein. Referring to FIG. 4, gates of PoSt FET memory cells are coupled to a word line (WL), while the back terminal and drain are coupled to the write bit-line (WBL) and read bit-line (RBL), respectively. The write ports are connected in a cross-point fashion (WL shared along the row and WBL shared along the column). A V/2 biasing for write is utilized as provided in Table 3 provided below.

TABLE 3

Biasing arrangement for the array of FIG. 4

| | Accessed cell | Half-accessed cells (row) | Half-accessed cells (column) | Un-accessed cells |
|---|---|---|---|---|
| WRITE | | | | |
| WL | $V_{DD}/2$ (P+) | $V_{DD}/2$ (P+) | 0 | 0 |
| | $-V_{DD}/2$ (P−) | $-V_{DD}/2$ (P−) | | 0 |
| RBL | 0 | 0 | 0 | 0 |
| WBL | $-V_{DD}/2$ (P+) | 0 | $-V_{DD}/2$ (P+) | 0 |
| | $V_{DD}/2$ (P−) | 0 | $V_{DD}/2$ (P−) | 0 |
| READ | | | | |
| WL | $V_{READ}$ | $V_{READ}$ | 0 | 0 |
| RBL | $V_{DD}/2$ | 0 | $V_{DD}/2$ | 0 |
| WBL | 0 | 0 | 0 | 0 |

From Table 3, it is seen that WBL and WL of the accessed cell is such that $|V_{GB}|=V_{DD}>V_C$ appears across PE, resulting in P switching. For example, to write P+, we apply $V_{DD}/2$ on WL and $-V_{DD}/2$ on WBL, resulting in $V_{GB}=V_{DD}$. Similarly, to write P−, we apply $-V_{DD}/2$ on WL and $V_{DD}/2$ on WBL for which $V_{GB}=-V_{DD}$. By applying $V_{DD}/2$ biasing, half-accessed cells get $|V_{DD}/2|<V_C$ across them due to either WL (in half-accessed column) or WBL (in half-accessed row). $|V_{DD}/2|<V_C$ in these cells prevents polarization switching. Moreover, in this biasing scheme WBL/WL of un-accessed cells can be kept at 0V. This minimizes write energy expended by these cells that is otherwise observed with assertion of WLs/BLs with conventional $V_{DD}$ swing. Note that we achieve non-volatile memory operation without any access transistors (unlike other memory cells used in arrays of the prior art). For read, a $V_{READ}$ is applied on WL and $V_{DD}$ on RBL of the accessed cell. The read current is sensed on RBL (shared along the column). No current flows through the half-accessed/un-accessed cells as they have either their gate voltage (WL) or drain voltage (RBL) or both set to 0.

Figure 5:
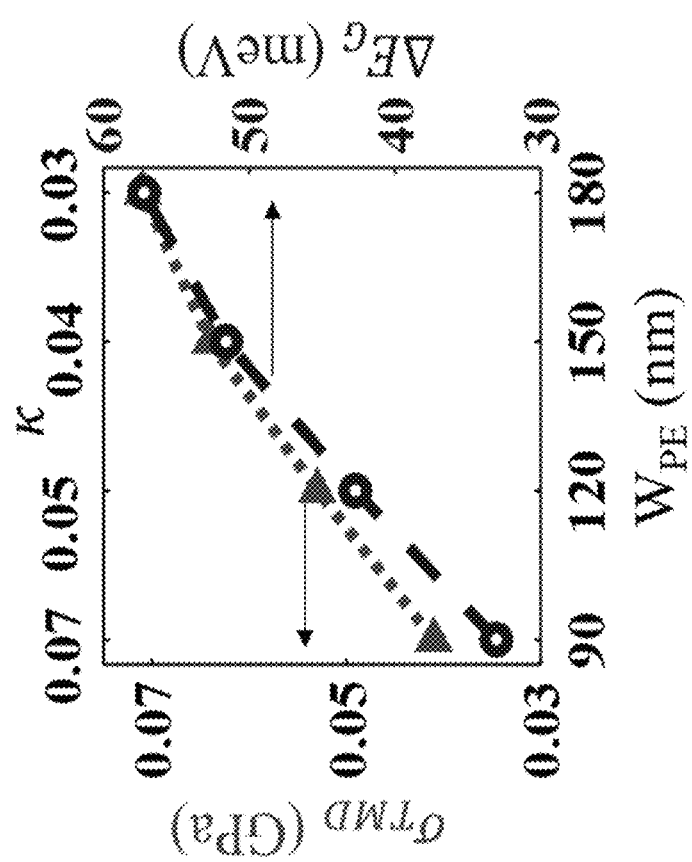
FIG. 5 is a graph of $\sigma_{TMD}$ in GPa and $\Delta E_G$ in meV vs. $W_{PE}$ in nm.
Figure 6:
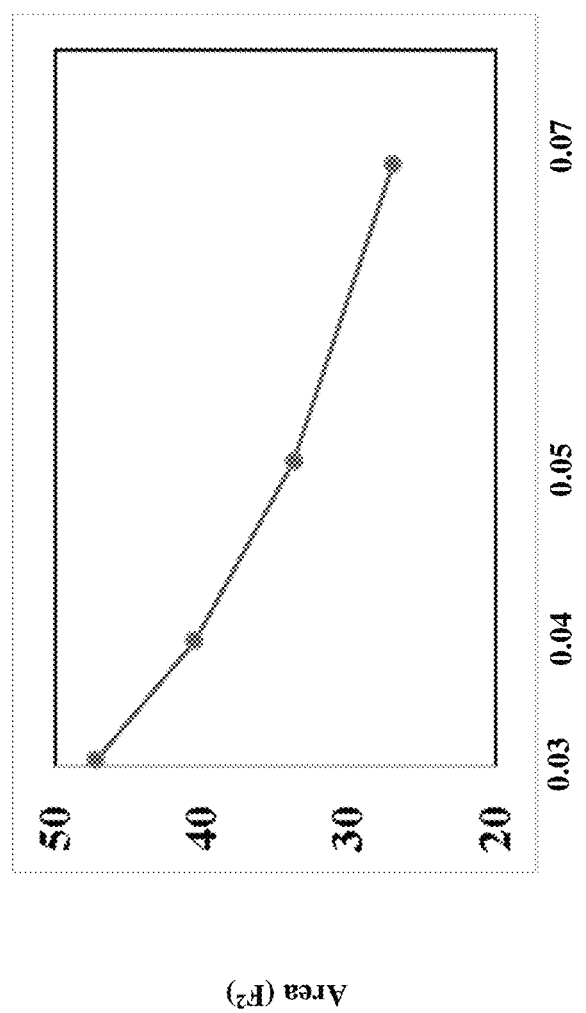
FIG. 6 is a graph of Area (in $F^2$ where F is minimum feature size of a technology) due to increased strain as κ decreases.
Figure 7:
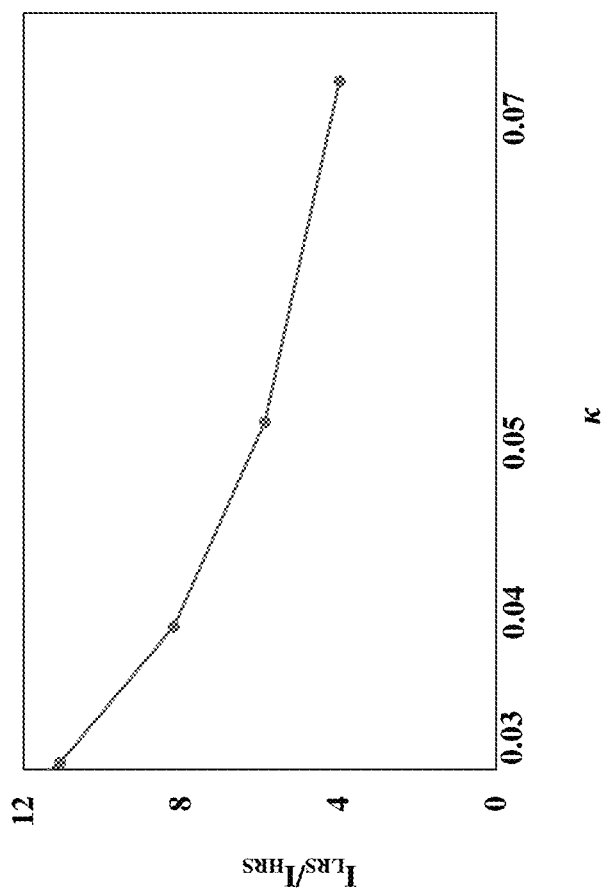
FIG. 7 is a graph of $I_{LRS}/I_{HRS}$ vs. κ.

PoSt FET shows a compact cell area in the range of $27F^2$–$47.25F^2$ (where F is the feature size) for $0.07>\kappa>0.03$ as shown in FIG. 5 FIG. 6 is a graph of $\sigma_{TMD}$ in GPa and $\Delta E_G$ in meV vs. $W_{PE}$ in nm. Distinguishability $I_{LRS}/I_{HRS}$ increases to about 12× at $\kappa=0.03$ compared to 3× at $\kappa=0.07$. This is because bandgap change $|\Delta E_G|$ (for both P+ and P−) increases as shown in FIG. 6 due to increased strain as $\kappa$ decreases, according to equation 1-3, above. Decreasing $\kappa$ further lowers resistance of PeFET in P+(higher $I_{LRS}$) but increases resistance for P− (low $I_{HRS}$) which ultimately results in improved distinguishability. A larger $\kappa$ ($=0.07$) offers higher integration density, lower write energy and lower read power, albeit at the cost of lower $I_{LRS}/I_{HRS}$, as shown in FIG. 7 which is a graph of $I_{LRS}/I_{HRS}$ vs. $\kappa$.

Those having ordinary skill in the art will recognize that numerous modifications can be made to the specific implementations described above. The implementations should not be limited to the particular limitations described. Other implementations may be possible.

The invention claimed is:

1. A polarization induced strain coupled two dimensional field effect transistor (PoSt FET) memory cell, comprising:
   a transistor comprising:
      a source contact;
      a drain contact;
      a gate contact;
      a back contact;
      a channel disposed atop the gate contact, wherein the channel and the gate are separated by an electrically insulating material; and
      a piezoelectric (PE)/ferroelectric(FE) (PE/FE) layer disposed between the gate contact and the back contact and configured to store bit information in form of ferroelectric polarization (P),
   wherein a ratio of cross-sectional area of the channel to cross-sectional area of the PE/FE layer is between about 0.03 to about 0.07.

2. The PoSt FET memory cell of claim 1, wherein the channel is made of a two dimensional transition metal dichalcogenides (2D TMD) material.

3. The PoSt FET memory cell of claim 2, wherein the 2D TMD material is selected from the group consisting of $MoS_2$, $MoSe_2$, $WS_2$, $WSe_2$, and any combinations thereof.

4. The PoSt FET memory cell of claim 1, wherein the PE/FE layer is made of a material selected from the group consisting of PZT, silicon doped $HfO_2$, and combinations thereof.

5. The PoSt FET memory cell of claim 4, wherein the PE/FE layer is made of PZT-5H.

6. The PoSt FET memory cell of claim 1, wherein the PE/FE layer is configured to maintain a bit value based on polarization of the PE/FE layer, whereby the polarization induced strain in the PE/FE layer that is transferred to the channel.

7. The PoSt FET memory cell of claim 6, wherein the bit value is read by i) applying a voltage across the gate contact and the back contact ($|V_{GB}|$) less than a coercive voltage ($V_C$) associated with the PE/FE layer, ii) applying a voltage across the gate contact and the source contact ($V_{GS}$) greater than a threshold voltage ($V_t$) of the transistor, and iii) comparing a source-to-drain current ($I_{DS}$) to threshold currents ($I_{LRS}/I_{HRS}$) where if the $I_{DS}$ is above the $I_{LRS}$, the bit value is associated with a first value and if the $I_{DS}$ is below the $I_{HRS}$, the but value is associated with a second value opposite the first value.

8. The PoSt FET memory cell of claim 6, wherein the bit value is written to by applying a voltage across the gate contact and the back contact ($|V_{GB}|$) greater than a coercive voltage ($V_C$) associated with the PE/FE layer, wherein if the $V_{GB}$ is greater than $V_c$, a P+ polarization is induced into the PE/FE layer, and if the $V_{GB}$ is less than $-V_c$, a P− polarization is induced into the PE/FE layer.

9. A method of maintain a digital bit value in a polarization induced strain coupled two dimensional field effect transistor (PoSt FET) memory cell, comprising:
   providing a transistor configured to maintain a bit value comprising:
      a source contact;
      a drain contact;
      a gate contact;
      a back contact;
      a channel disposed atop the gate contact, wherein the channel and the gate are separated by an electrically insulating material; and
      a piezoelectric (PE)/ferroelectric(FE) (PE/FE) layer disposed between the gate contact and the back contact and configured to store bit information in form of ferroelectric polarization (P),
   wherein a ratio of cross-sectional area of the channel to cross-sectional area of the PE/FE layer is between about 0.03 to about 0.07, and
   wherein the bit value is maintained based on polarization of the PE/FE layer, whereby the polarization induced strain in the PE/FE layer is transferred to the channel.

10. The method of claim 9, wherein the channel is made of a two dimensional transition metal dichalcogenides (2D TMD) material selected from the group consisting of $MoS_2$, $MoSe_2$, $WS_2$, $WSe_2$, and any combinations thereof and the PE/FE layer is made of a material selected from the group consisting of PZT, silicon doped $HfO_2$, and combinations thereof.

11. The method of claim 10, wherein the PE/FE layer is made of PZT-5H.

12. The method of claim 9, further comprising:
reading the bit value by i) applying a voltage across the gate contact and the back contact ($V_{GB}$) less than a coercive voltage ($V_C$) associated with the PE/FE layer, ii) applying a voltage across the gate contact and the source contact ($V_{GS}$) greater than a threshold voltage ($V_t$) of the transistor, and iii) comparing a source-to-drain current ($I_{DS}$) to threshold currents ($I_{LRS}/I_{HRS}$) where if the $I_{DS}$ is above the $I_{LRS}$, the bit value is associated with a first value and if the $I_{DS}$ is below the $I_{HRS}$, the but value is associated with a second value opposite the first value,
writing the bit value by applying the $|V_{GB}|$ greater than the $V_C$ associated with the PE/FE layer, wherein if the $V_{GB}$ is greater than $V_c$, a P+ polarization is induced into the PE/FE layer, and if the $V_{GB}$ is less than $-V_c$, a P− polarization is induced into the PE/FE layer.

13. A memory array, comprising:
a plurality of polarization induced strain coupled two dimensional field effect transistor (PoSt FET) memory cells, disposed in one or more rows and one or more columns, each PoSt FET memory cell comprising:
a transistor comprising:
a source contact;
a drain contact;
a gate contact;
a back contact;
a channel disposed atop the gate contact, wherein the channel and the gate are separated by an electrically insulating material; and
a piezoelectric (PE)/ferroelectric(FE) (PE/FE) layer disposed between the gate contact and the back contact and configured to store bit information in form of ferroelectric polarization (P),
wherein a ratio of cross-sectional area of the channel to cross-sectional area of the PE/FE layer is between about 0.03 to about 0.07,
the gate contact of each of the PoSt FET memory cells in each row of the one or more rows is coupled to an associated word line (WL) for said row,
the back contact of each of the PoSt FET memory cells in each column of the one or more columns is coupled to an associated write bit line (WBL) for said column, and
drain contact of each of the PoSt FET memory cells in each column of the one or more columns is coupled to an associated read bit line (RBL) for said column,
wherein a PoSt FET memory cell in a row and a column is written to by activating an associated WBL and WL and a PoSt FET memory cell in a row and a column is read from by activating an associated RBL and WL.

14. The memory array of claim 13, wherein the channel is made of a two dimensional transition metal dichalcogenides (2D TMD) material.

15. The memory array of claim 14, wherein the 2D TMD material is selected from the group consisting of $MoS_2$, $MoSe_2$, $WS_2$, $WSe_2$, and any combinations thereof.

16. The memory array of claim 13, wherein the PE/FE layer is made of a material selected from the group consisting of PZT, silicon doped $HfO_2$, and combinations thereof.

17. The memory array of claim 16, wherein the PE/FE layer is made of PZT-5H.

18. The memory array of claim 13, wherein the PE/FE layer is configured to maintain a bit value based on polarization of the PE/FE layer, whereby the polarization induced strain in the PE/FE layer that is transferred to the channel.

19. The memory array of claim 18, wherein the bit value of an associated PoSt FET memory cell is read by i) applying a voltage across the gate contact and the back contact ($|V_{GB}|$) less than a coercive voltage ($V_C$) associated with the PE/FE layer, ii) applying a voltage across the gate contact and the source contact ($V_{GS}$) greater than a threshold voltage ($V_t$) of the transistor, and iii) comparing a source-to-drain current ($I_{DS}$) to threshold currents ($I_{LRS}/I_{HRS}$) where if the $I_{DS}$ is above the $I_{LRS}$, the bit value is associated with a first value and if the $I_{DS}$ is below the $I_{HRS}$, the but value is associated with a second value opposite the first value.

20. The memory array of claim 19, wherein the PoSt FET memory cells that are not to be read are governed by one of A) the $|V_{GB}|$ is less than the $V_C$ and the $V_{GS}$ is smaller than the $V_t$ of the transistor; or B) the $|V_{GB}|$ is less than the $V_C$ and a substantially zero voltage across the drain contact and the source contact ($V_{DS}$).

21. The memory array of claim 18, wherein the bit value is written to by applying a voltage across the gate contact and the back contact ($|V_{GB}|$) greater than a coercive voltage ($V_C$) associated with the PE/FE layer, wherein if the $V_{GB}$ is greater than $V_c$, a P+ polarization is induced into the PE/FE layer, and if the $V_{GB}$ is less than $-V_c$, a P− polarization is induced into the PE/FE layer.

22. The memory array of claim 21, wherein the PoSt FET memory cells that are not to be written to are governed by one of A) ($|V_{GB}|$) is less than the coercive voltage for the associated PoSt FET memory cells; or B) substantially zero volts at the $V_{GB}$, substantially zero volts across the gate contact and the source contact ($V_{GS}$), and substantially zero volts across the drain contact and the source contact ($V_{DS}$).

* * * * *